(12) United States Patent
Jung et al.

(10) Patent No.: US 11,538,549 B2
(45) Date of Patent: Dec. 27, 2022

(54) TEST CIRCUIT AND SEMICONDUCTOR MEMORY SYSTEM INCLUDING THE TEST CIRCUIT

(71) Applicant: SK hynix Inc., Icheon-si (KR)

(72) Inventors: Jong Seok Jung, Icheon-si (KR); Sung Won Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 37 days.

(21) Appl. No.: 17/160,686

(22) Filed: Jan. 28, 2021

(65) Prior Publication Data
US 2022/0076775 A1 Mar. 10, 2022

(30) Foreign Application Priority Data

Sep. 10, 2020 (KR) .................. 10-2020-0115880

(51) Int. Cl.
*G11C 29/00* (2006.01)
*G11C 29/50* (2006.01)

(52) U.S. Cl.
CPC .. *G11C 29/50012* (2013.01); *G11C 29/50004* (2013.01); *G11C 2029/5004* (2013.01)

(58) Field of Classification Search
CPC ........ G11C 29/50012; G11C 29/50004; G11C 2029/5004
See application file for complete search history.

(56) References Cited

U.S. PATENT DOCUMENTS

| | | | | | |
|---|---|---|---|---|---|
| 5,991,905 | A | * | 11/1999 | Gagea | F02D 41/249 714/E11.005 |
| 2007/0145981 | A1 | * | 6/2007 | Tomita | G11C 29/028 324/509 |
| 2020/0081039 | A1 | * | 3/2020 | Kim | G01R 31/3183 |
| 2022/0034962 | A1 | * | 2/2022 | Kazarians | G01R 22/10 |

FOREIGN PATENT DOCUMENTS

| | | | |
|---|---|---|---|
| KR | 1020020038588 | A | 5/2002 |
| KR | 100499849 | B1 | 7/2005 |
| KR | 101276439 | B1 | 6/2013 |
| KR | 1020220020710 | A | 2/2022 |

* cited by examiner

*Primary Examiner* — Christine T. Tu
(74) *Attorney, Agent, or Firm* — William Park & Associates Ltd.

(57) ABSTRACT

A test circuit includes a control circuit and a counting circuit. The control circuit is configured to control a charging operation and a discharging operation on a test node. The counting circuit is configured to generate counting information by performing a counting operation during a unit measurement interval.

23 Claims, 4 Drawing Sheets

TEST CIRCUIT AND SEMICONDUCTOR MEMORY SYSTEM INCLUDING THE TEST CIRCUIT

CROSS-REFERENCES TO RELATED APPLICATION

The present application claims priority under 35 U.S.C. § 119(a) to Korean application number 10-2020-0115880, filed on Sep. 10, 2020, in the Korean Intellectual Property Office, which is incorporated herein by reference in its entirety.

BACKGROUND

1. Technical Field

Various embodiments generally relate to a test circuit and a semiconductor memory system including the test circuit, and more particularly, to a test circuit for detecting a defect of a metal line coupled to a test node of a test target circuit, and a semiconductor memory system including the test circuit for detecting a defect of a metal line coupled to a test node of the test target circuit.

2. Related Art

In general, an integrated circuit including a semiconductor device and a semiconductor memory device is sold to a consumer after being subjected to various test operations. The integrated circuit has an internal structure in which a plurality of internal circuits are coupled through a metal line and highly integrated. Therefore, when an unintended defect occurs in the metal line, the integrated circuit cannot perform a desired operation. Therefore, the integrated circuit requires a test operation for analyzing the defect of the metal line.

SUMMARY

In an embodiment, a test circuit may include: a control circuit configured to control a charging operation and a discharging operation on a test node of a test target circuit; and a counting circuit configured to generate counting information corresponding to a defect of the test node by counting a counting dock signal during a unit measurement interval from a point of time that the charging operation on the test node is completed to a point of time that the discharging operation on the test node is completed.

In an embodiment, a test circuit may include: a control circuit configured to control a charging operation and a discharging operation on a test node of a test target circuit; a setting circuit configured to set a total measurement interval based on interval extension information and a unit measurement interval from a point of time that the charging operation on the test node is completed to a point of time that the discharging operation on the test node is completed; and a counting circuit configured to generate counting information corresponding to a defect of the test node by counting a counting clock signal during the total measurement interval corresponding to an output signal of the setting circuit.

In an embodiment, a semiconductor memory system may include: a memory circuit having a plurality of memory cells coupled to a word line; and a test circuit configured to perform a charging operation and a discharging operation on a test node coupled to the word line, and generate counting information corresponding to a defect of the test node by performing a counting operation during a unit measurement interval from a point of time that the charging operation on the test node is completed to a point of time that the discharging operation on the test node is completed.

DETAILED DESCRIPTION

Figure 1:
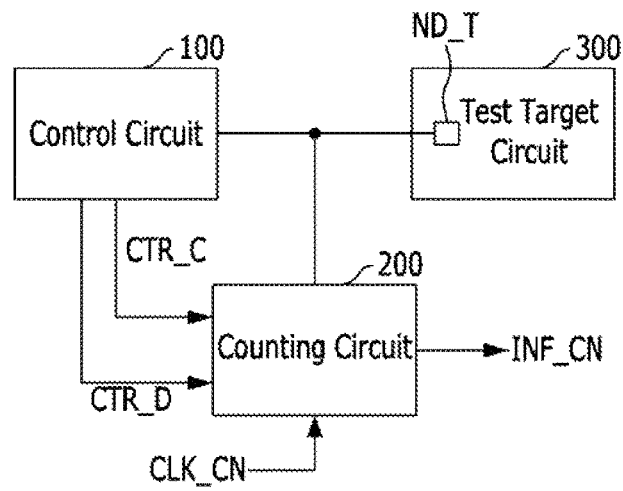
FIG. 1 is a block diagram illustrating a configuration of a test circuit in accordance with an embodiment.

The description of the present disclosure is merely an embodiment for a structural and/or functional description. The scope of rights of the present disclosure should not be construed as being limited to embodiments described in the specification. That is, the scope of rights of the present disclosure should be understood as including equivalents, which may realize the technical spirit, because an embodiment may be modified in various ways and may have various forms. Furthermore, objects or effects proposed in the present disclosure do not mean that a specific embodiment should include all objects or effects or include only such effects. Accordingly, the scope of rights of the present disclosure should not be understood as being limited thereby.

The meaning of the terms that are described in this application should be understood as follows.

The terms, such as the "first" and the "second," are used to distinguish one element from another element, and the scope of the present disclosure should not be limited by the terms. For example, a first element may be named a second element. Likewise, the second element may be named the first element.

An expression of the singular number should be understood as including plural expressions, unless clearly expressed otherwise in the context. The terms, such as "include" or "have," should be understood as indicating the existence of a set characteristic, number, step, operation, element, part, or a combination thereof, not excluding a possibility of the existence or addition of one or more other characteristics, numbers, steps, operations, elements, parts, or a combination thereof.

In each of steps, symbols (e.g., a, b, and c) are used for convenience of description, and the symbols do not describe order of the steps. The steps may be performed in order different from order described in the context unless specific order is dearly described in the context. That is, the steps may be performed according to described order, may be performed substantially at the same time as the described order, or may be performed in reverse order of the described order.

All the terms used herein, including technological or scientific terms, have the same meanings as those that are typically understood by those skilled in the art, unless otherwise defined. Terms defined in commonly used dictionaries should be construed as having the same meanings as those in the context in related technology and should not be construed as having ideal or excessively formal meanings, unless clearly defined in the application.

Hereafter, for convenience of description, a circuit on which a test operation is performed will be referred to as 'test target circuit'.

Various embodiments are directed to a test circuit capable of measuring a defect of a metal line by controlling a charging operation and a discharging operation on a test node.

Also, various embodiments are directed to a test circuit capable of performing a test operation by adjusting a test condition according to the number of internal circuits coupled to a test node through a metal line.

Also, various embodiments are directed to a memory system capable of measuring a defect of a word line by controlling a charging operation and a discharging operation on a test node, with preset data stored in a plurality of memory cells.

In accordance with the present embodiments, it may be possible to measure a defect of the metal line by controlling the charging operation and the discharging operation on the test node.

Furthermore, it may be possible to secure various test conditions by adjusting the test conditions according to the number of internal circuits coupled to the test node through the metal line.

Furthermore, it may be possible to derive various analysis results on a semiconductor memory device by performing various operations, with preset data stored in a plurality of memory cells.

Objects of the present disclosure are not limited to the aforementioned objects, and other objects not described above may be evidently understood by those skilled in the art, to which the present disclosure pertains, from the following description.

FIG. 1 is a block diagram illustrating a configuration of a test circuit in accordance with an embodiment.

Referring to FIG. 1, the test circuit may include a control circuit 100, a counting circuit 200 and a test target circuit 300.

The control circuit 100 may be configured to control a charging operation and a discharging operation on a test node ND_T of the test target circuit 300. The test target circuit 300 may include an integrated circuit including a semiconductor device and a semiconductor memory device. As described above, the integrated circuit may include a plurality of internal circuits coupled through a metal line. The metal line may be coupled to the test node ND_T. Therefore, the control circuit 100 may charge the test node ND_T through the charging operation, and discharge the test node ND_T through the discharging operation.

The counting circuit 200 may be configured to generate counting information INF_CN by counting a counting clock signal CLK_CN during a unit measurement interval from a point of time that the charging operation on the test node ND_T is completed to a point of time that the discharging operation on the test node ND_T is completed. The point of time that the charging operation is completed may indicate a point of time that the voltage level of the test node ND_T is raised to a preset charging voltage level through the charging operation. Furthermore, the point of time that the discharging operation is completed may indicate a point of time that the voltage level of the test node ND_T is lowered to a preset discharging voltage level through the discharging operation, Although described below in FIG. 2, the counting circuit 200 may receive the point of time that the charging operation is completed and the point of time that the discharging operation is completed, based on a charging control signal CTR_C having a logic level value set according to the preset charging voltage level and a discharging control signal CTR_D having a logic level value set according to the preset discharging voltage level. The charging control signal CTR_C and the discharging control signal CTR_D will be described with reference to FIG. 2. The word "preset" as used herein with respect to a parameter, such as a preset charging voltage level and preset data, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

Figure 4:
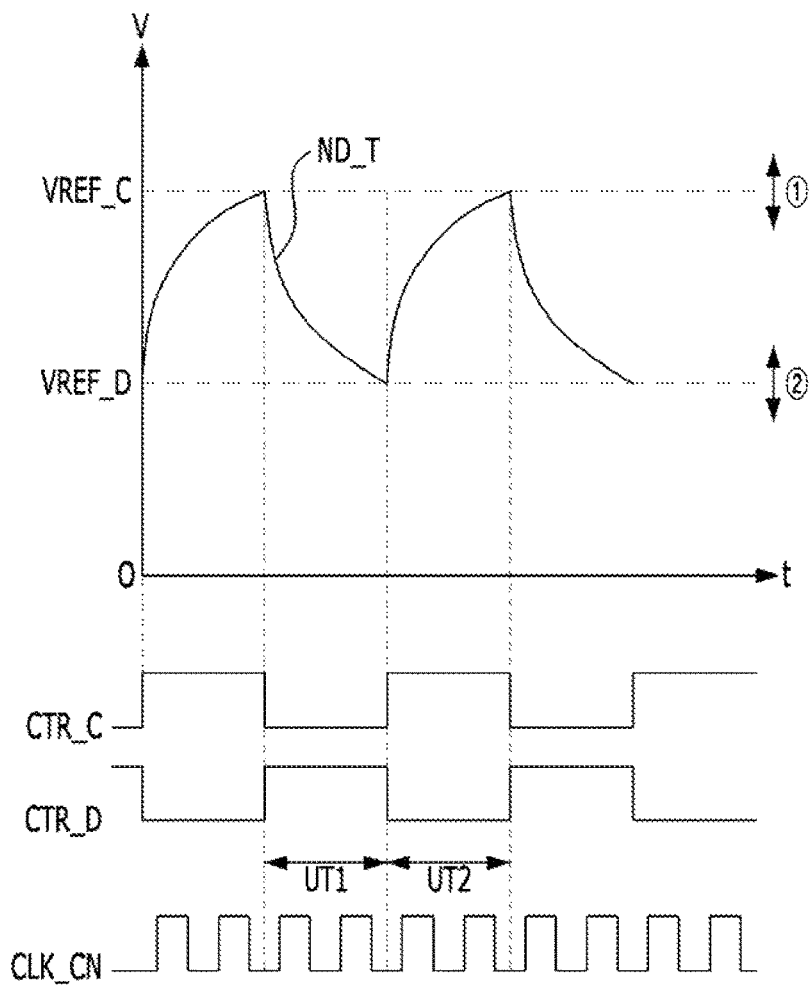
FIG. 4 is a timing diagram for schematically describing test operations of the test circuits of FIGS. 1 and 3.

The unit measurement interval may include a first unit measurement interval UT1 and a second unit measurement interval UT2, which correspond to a point of time that the charging operation on the test node ND_T is completed and a point of time that the discharging operation on the test node ND_T is completed. As illustrated in FIG. 4 which will be described below, the first unit measurement interval UT1 may include an interval from a point of time that the charging operation on the test node ND_T is completed to a point of time that the discharging operation on the test node ND_T is completed. The second unit measurement interval UT2 may include an interval from a point of time that the discharging operation on the test node ND_T is completed to a point of time that the charging operation on the test node ND_T is completed. The first and second unit measurement intervals UT1 and UT2 will be described again with reference to FIG. 4.

The counting dock signal CLK_CN may be a clock signal for the counting operation. The counting clock signal CLK_CN may be provided from the inside or outside of the test circuit. The counting circuit 200 which performs a counting operation based on the counting clock signal CLK_CN may be implemented as various embodiments. The counting circuit 200 may count the counting clock signal CLK_CN during at least one unit measurement interval of the first and second unit measurement intervals UT1 and UT2 which are set based on the charging control signal CTR_C and the discharging control signal CTR_D which will be described below.

Then, the counting circuit 200 may generate the counting information INF_CN, corresponding to a defect of the metal line coupled to the test node ND_T, through the counting operation. In other words, the counting circuit 200 may generate a counting value through the counting operation. The counting circuit 200 may have a counting operation time which is changed according to at least one unit measurement interval of the first and second unit measurement intervals UT1 and UT2. At least one unit measurement interval of the first and second unit measurement intervals UT1 and UT2 may be changed according to a defect of the metal line. Therefore, the counting information IN_FCN including the counting value may include information corresponding to the defect of the metal line.

Figure 2:
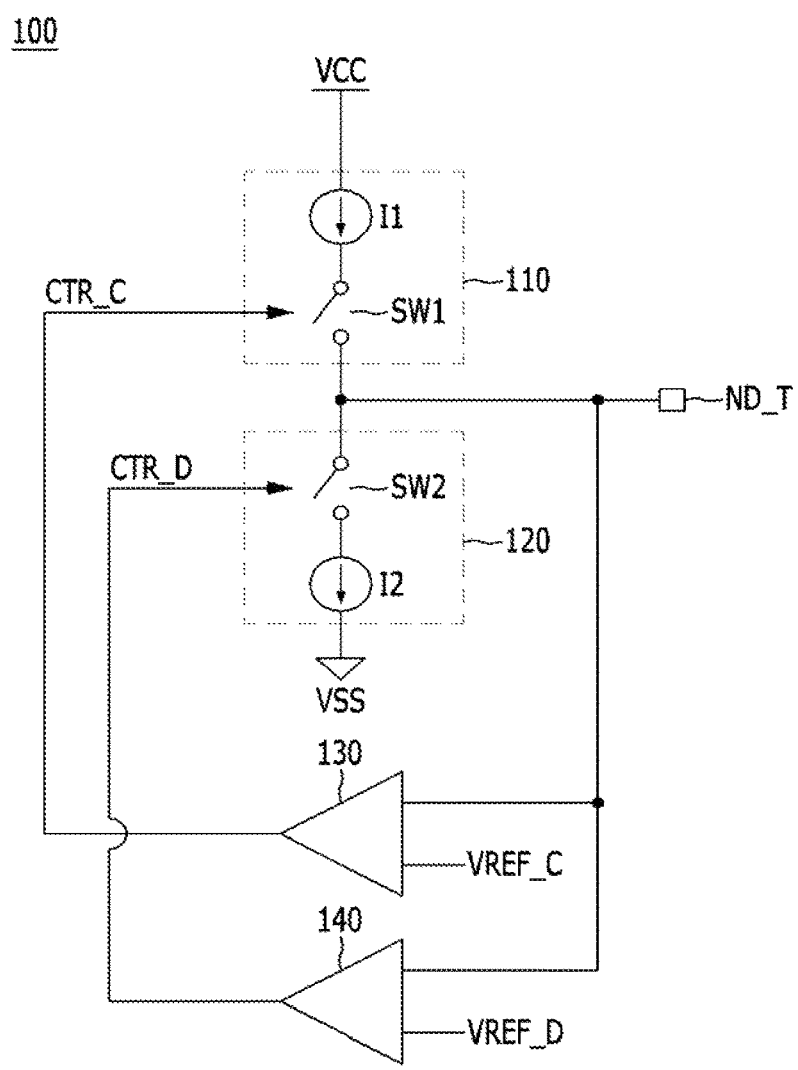
FIG. 2 is a circuit diagram illustrating a configuration of a control circuit of FIG. 1.

FIG. 2 is a circuit diagram illustrating a configuration of the control circuit 100 of FIG. 1 and the test node NDT of the test target circuit 300 of FIG. 1.

Referring to FIG. 2, the control circuit 100 may include a charging circuit 110, a discharging circuit 120, a first comparison circuit 130 and a second comparison circuit 140.

The charging circuit 110 may be configured to charge the test node ND_T based on the charging control signal CTR_C. The charging circuit 110 may include a first current source circuit I1 and a first switching circuit SW1 which are coupled in series between a supply voltage terminal VCC and the test node ND_T. The first switching circuit SW1 may control an operation of coupling the first current source circuit I1 and the test node NDT based on the charging control signal CTR_C. Thus, the charging circuit 110 may charge the test node ND_T with a voltage applied to the supply voltage terminal VCC based on the charging control signal CTR_C. The first switching circuit SW1 may include a PMOS transistor or NMOS transistor. The first switching circuit SW1 may be configured as an NMOS transistor, for example. Thus, the first switching circuit SW1 may be turned on when the charging control signal CTR_C becomes logic 'high', and turned off when the charging control signal CTR_C becomes logic 'low'. When the first switching circuit SW1 is turned on, the charging operation on the test node ND_T may be performed, The discharging circuit 120 may be configured to discharge the test node ND_T based on the discharging control signal CTR_D. The discharging circuit 120 may include a second switching circuit SW2 and a second current source circuit I2 which are coupled in series between the test node ND_T and a ground voltage terminal VSS. The second switching circuit SW2 may control an operation of coupling the test node ND_T and the second current source circuit I2 based on the discharging control signal CTR_D, Thus, the discharging circuit 120 may discharge the voltage stored in the test node ND_T to the ground voltage terminal VSS, based on the discharging control signal CTR_D. The second switching circuit SW2 may include a PMOS transistor or NMOS transistor. The second switching circuit SW2 may be configured as an NMOS transistor, for example. Thus, the second switching circuit SW2 may be turned on when the discharging control signal CTR_D becomes logic 'high', and turned off when the discharging control signal CTR_D becomes logic 'low'. When the second switching circuit SW2 is turned on, the discharging operation on the test node ND_T may be performed.

The first comparison circuit 130 may be configured to generate the charging control signal CTR_C by comparing the voltage of the test node ND_T to the voltage level of a charging reference voltage VREF_C. The charging reference voltage VREF_C may correspond to a target charging voltage level during the charging operation on the test node ND_T, Therefore, the first comparison circuit 130 may generate the charging control signal CTR_C which may turn on the first switching circuit SW1 of the charging circuit 110 when the voltage of the test node ND_T has a lower voltage level than the charging reference voltage VREF_C. When the first switching circuit SW1 is turned on, it may indicate that the first current source circuit I1 and the test node ND_T are coupled to each other, That is, the test node ND_T may be charged based on the charging control signal CTR_C.

The second comparison circuit 140 may be configured to generate the discharging control signal CTR_D by comparing the voltage of the test node ND_T to the voltage level of a discharging reference voltage VREF_D. The discharging reference voltage VREF_D may correspond to a target discharging voltage level during the discharging operation on the test node ND_T. Therefore, the second comparison circuit 140 may generate the discharging control signal CTR_D which may turn on the second switching circuit SW2 of the discharging circuit 120 when the voltage of the test node ND_T has a higher voltage level than the discharging reference voltage VREF_D. When the second switching circuit SW2 is turned on, it may indicate that the test node NDT and the second current source circuit I2 are coupled to each other. That is, the test node ND_T may be discharged based on the discharging control signal CTR_D.

Referring back to FIG. 1, the counting circuit 200 may perform a counting operation based on at least one control signal of the charging control signal CTR_C and the discharging control signal CTR_D. For convenience of description, the following descriptions will be made with reference to FIGS. 1 and 4.

First, the case in which the counting operation of the counting circuit 200 is controlled based on the charging control signal CTR_C will be described. As described with reference to FIG. 2, the charging control signal CTR_C may be generated by the first comparison circuit 130. The charging control signal CTR_C may be disabled or enabled based on the charging reference voltage VREF_C. When the charging control signal CTR_C is disabled, it may indicate that the charging operation on the test node ND_T is completed. When the charging control signal CTR_C is enabled, it may indicate that the charging operation on the test node ND_T is started. That is, the first unit measurement interval UT1 may be defined based on the charging control signal CTR_C.

Therefore, the counting circuit 200 may perform the counting operation from a point of time that the charging operation is completed to a point of time that the charging operation is started. The point of time that the charging operation is completed may indicate a point of time that the charging control signal CTR_C is disabled, and the point of time that the charging operation is started may indicate a point of time that the charging control signal CTR_C is enabled. The point of time that the charging operation is started may correspond to the point of time that the discharging operation is completed. In other words, the counting circuit 200 may perform the counting operation from the point of time that the charging operation on the test node ND_T is completed to the point of time that the discharging operation on the test node ND_T is completed. That is, the counting circuit 200 may perform the counting operation during the first unit measurement interval UT1, based on the charging control signal CTR_C.

Next, the case in which the counting operation of the counting circuit 200 is controlled based on the discharging control signal CTR_D will be described. As described with reference to FIG. 2, the discharging control signal CTR_D may be generated by the second comparison circuit 140. The discharging control signal CTR_D may be disabled or enabled based on the discharging reference voltage VREF_D. When the discharging control signal CTR_D is enabled, it may indicate that the discharging operation on the test node ND_T is started. When the discharging control signal CTR_D is disabled, it may indicate that the discharging operation on the test node ND_T is completed. That is, the first unit measurement interval UT1 may also be defined based on the discharging control signal CTR_D.

Therefore, the counting circuit 200 may perform the counting operation from a point of time that the discharging operation is started to a point of time that the discharging operation is completed. The point of time that the discharging operation is started may indicate a point of time that the discharging control signal CTR_D is enabled, and the point of time that the discharging operation is completed may indicate a point of time that the discharging control signal CTR_D is disabled. The point of time that the discharging operation is started may correspond to the point of time that the charging operation is completed. In other words, the counting circuit 200 may perform the counting operation from the point of time that the charging operation on the test node ND_T is completed to the point of time that the discharging operation on the test node ND_T is completed. That is, the counting circuit 200 may perform the counting operation during the first unit measurement interval UT1, based on the discharging control signal CTR_D.

As described above, the counting circuit 200 may perform the counting operation during the first unit measurement interval UT1 corresponding to at least one control signal of the charging control signal CTR_C and the discharging control signal CTR_D.

Then, the second unit measurement interval UT2 may also be controlled based on at least one control signal of the charging control signal CTR_C and the discharging control signal CTR_D. The second unit measurement interval UT2 may include an interval from a point of time that the discharging operation on the test node ND_T is completed to a point of time that the charging operation on the test node ND_T is completed. Therefore, the counting circuit 200 may perform the counting operation during the second unit measurement interval UT2 corresponding to at least one control signal of the charging control signal CTR_C and the discharging control signal CTR_D.

The test circuit in accordance with the present embodiment may control the charging operation and the discharging operation on the test node ND_T. Furthermore, the test circuit may perform the counting operation during at least one unit measurement interval of the first and second unit measurement intervals UT1 and UT2, based on the discharging control signal CTR_D and the charging control signal CTR_C. Furthermore, a test operator may analyze a defect of the metal line coupled to the test node ND_T, based on the counting information INF_CN generated through the counting operation.

Figure 3:
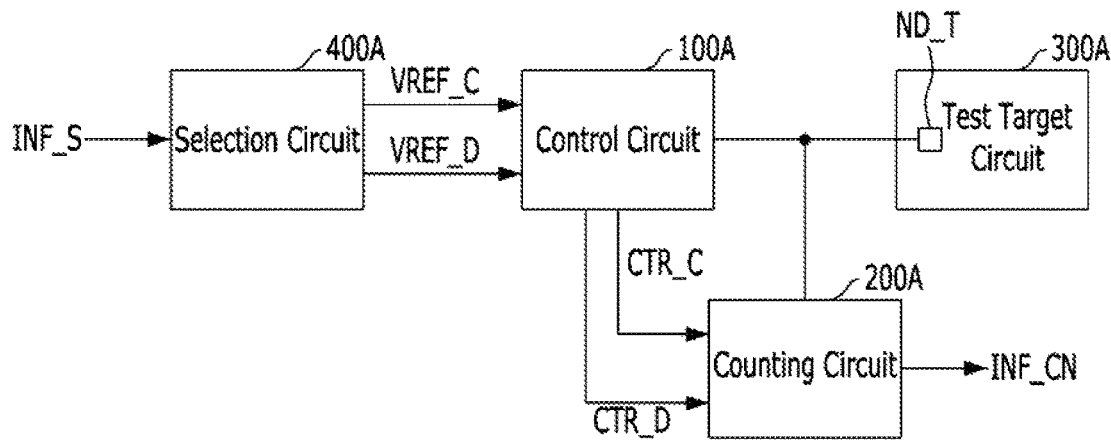
FIG. 3 is a block diagram illustrating a configuration of a test circuit in accordance with an embodiment.

FIG. 3 is a block diagram illustrating a configuration of a test circuit in accordance with an embodiment.

Referring to FIG. 3, the test circuit may include a control circuit 100A, a counting circuit 200A, a test target circuit 300A and a selection circuit 400A. The control circuit 100A, the counting circuit 200A and the test target circuit 300A may correspond to the control circuit 100, the counting circuit 200 and the test target circuit 300 of FIG. 1, respectively. Therefore, the detailed descriptions of the configurations and functions of the control circuit 100A, the counting circuit 200A and the test target circuit 300A will be omitted herein. The test circuit of FIG. 3 may be different from the test circuit of FIG. 1 in that the test circuit of FIG. 3 includes the selection circuit 400A, Hereafter, the selection circuit 400A will be described.

The selection circuit 400A may be configured to select and output the voltage level of at least one reference voltage of the charging reference voltage VREF_C and the discharging reference voltage VREF_D, based on voltage selection information INF_S. That is, the charging reference voltage VREF_C may have a voltage level that is raised or lowered based on the voltage selection information INF_S. The discharging reference voltage VREF_D may also have a voltage level that is raised or lowered based on the voltage selection information INF_S. When the voltage levels of the charging reference voltage VREF_C and the discharging reference voltage VREF_D can be selected, it may indicate that the first or second unit measurement interval UT1 or UT2 of FIG. 4 can be adjusted, Each of the first and second unit measurement intervals UT1 and UT2 may correspond to a test operation time.

The test circuit in accordance with the present embodiment may adjust the voltage levels of the charging reference voltage VREF_C and the discharging reference voltage VREF_D. Therefore, the test circuit may derive various test results according to various test conditions.

FIG. 4 is a timing diagram for schematically describing test operations of the test circuits of FIGS. 1 and 3.

Referring to FIG. 4, the test node ND_T may be charged based on the charging control signal CTR_C. That is, when the charging control signal CTR_C is enabled to a logic 'high' level, the voltage level of the test node ND_T may be gradually raised through the charging operation. At this time, the voltage level of the test node ND_T may be raised to the charging reference voltage VREF_C through the charging operation. The test node ND_T may be discharged based on the discharging control signal CTR_D. That is, when the discharging control signal CTR_D is enabled to a logic 'high' level, the voltage level of the test node ND_T may be gradually lowered through the discharging operation. At this time, the voltage level of the test node ND_T may be lowered to the discharging reference voltage VREF_D through the discharging operation.

The first unit measurement interval UT1 may include an interval from a point of time that the charging operation on the test node ND_T is completed to a point of time that the discharging operation on the test node ND_T is completed. Therefore, the counting circuit 200 of FIG. 1 and the counting circuit 200A of FIG. 3 may count the counting clock signal CLK_CN during the first unit measurement interval UT1, and output the counting value as the counting information INF_CN. The first unit measurement interval UT1 may correspond to the discharging operation on the test node ND_T. Therefore, the counting information INF_CN corresponding to the first unit measurement interval UT1 may be used to analyze a defect of the metal line coupled to the test node ND_T during the discharging operation.

The second unit measurement interval UT2 may include an interval from a point of time that the discharging operation on the test node ND_T is completed to a point of time that the charging operation on the test node ND_T is completed. The second unit measurement interval UT2 may correspond to the charging operation on the test node ND_T. Therefore, the counting information INF_CN corresponding to the second unit measurement interval UT2 may be used to analyze a defect of the metal line coupled to the test node ND_T during the charging operation.

The selection circuit 400A of FIG. 3 may select the voltage levels of the charging reference voltage VREF_C and the discharging reference voltage VREF_D based on the voltage selection information INF_S. That is, the charging reference voltage VREF_C may have a voltage level that is raised or lowered based on the voltage selection information INF_S, as indicated by ①. The discharging reference voltage VREF_D may have a voltage level that is raised or lowered based on the voltage selection information INF_S, as indicated by ②. When the voltage levels of the charging reference voltage VREF_C and the discharging reference voltage VREF_D can be adjusted, it may indicate that the test operation times corresponding to the charging operation and the discharging operation can be adjusted.

The test circuit in accordance with the present embodiment may adjust at least one unit measurement interval of the first and second unit measurement intervals UT1 and UT2, thereby securing various test operation times corresponding to the charging operation and the discharging operation, respectively.

The voltage selection information INF_S may correspond to a loading value of the test node ND_T. That is, the voltage levels of the charging reference voltage VREF_C and the discharging reference voltage VREF_D may be changed according to the loading value of the test node ND_T. Therefore, the test circuit in accordance with the present embodiment may selectively control the test operation time based on the loading value of the metal line coupled to the test node ND_T. Therefore, the test circuit may provide the optimized test operation time according to the loading value of the metal line coupled to the test node ND_T.

Figure 5:
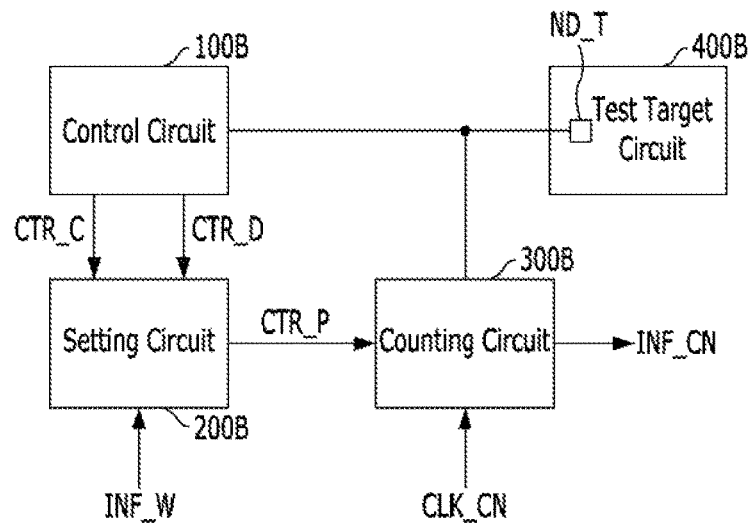
FIG. 5 is a block diagram illustrating a configuration of a test circuit in accordance with an embodiment.

FIG. 5 is a block diagram illustrating a configuration of a test circuit in accordance with an embodiment.

Referring to FIG. 5, the test circuit may include a control circuit 100B, a setting circuit 200B, a counting circuit 300B and a test target circuit 400B.

The control circuit 100E may be configured to control a charging operation and a discharging operation on a test node ND_T of the test target circuit 400B. The control circuit 100B and the test target circuit 400B may correspond to the control circuit 100 and the test target circuit 300 of FIG. 1, respectively.

The setting circuit 200B may be configured to set a total measurement interval based on interval extension information INF_W and a unit measurement interval from a point of time that the charging operation on the test node ND_T is completed to a point of time that the discharging operation on the test node ND_T is completed. The interval extension information INF_W may be information for setting the number of unit measurement intervals included in the total measurement interval during a test operation.

Next, the setting circuit 2003 may generate an interval setting signal CTR_P corresponding to the total measurement interval based on the interval extension information the charging control signal CTR_C and the discharging control signal CTR_D, which are generated by the control circuit 100 of FIG. 2, corresponding to the control circuit 1003. As described above, the unit measurement interval may be defined based on at least one control signal of the charging control signal CTR_C and the discharging control signal CTR_D, The total measurement interval may include unit intervals corresponding to the interval extension information INF_W, Therefore, the setting circuit 200B may generate the interval setting signal CTR_P corresponding to the total measurement interval, based on the charging control signal CTR_C, the discharging control signal CTR_D and the interval extension information INF_W. The interval setting signal CTR_P may have a pulse width corresponding to the total measurement interval. The interval setting signal CTR_P will be described again with reference to FIG. 6.

The counting circuit 300B may be configured to generate counting information INF_CN by counting the counting clock signal CLK_CN during the total measurement interval corresponding to the interval setting signal CTR_P which is an output signal of the setting circuit 2003. The counting circuit 3003 may be implemented as various embodiments. The counting circuit 300B may count the counting clock signal CLK_CN based on the pulse width of the interval setting signal CTR_P corresponding to the total measurement interval. The relation between the total measurement interval and the interval setting signal CTR_P will be described with reference to FIG. 6.

Figure 6:
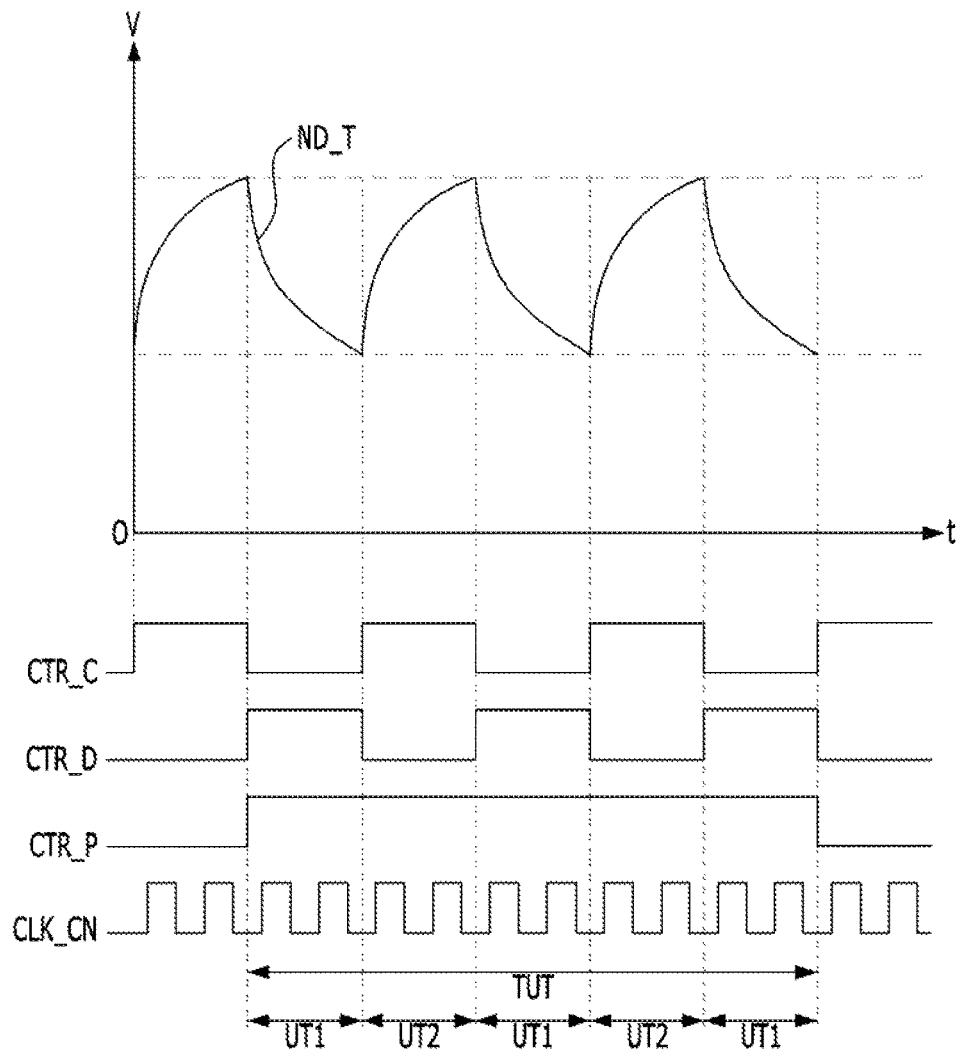
FIG. 6 is a timing diagram for schematically describing a test operation of the test circuit of FIG. 5.

FIG. 6 is a timing diagram for schematically describing a test operation of the test circuit of FIG. 5.

Referring to FIG. 6, the test node ND_T may be charged based on the charging control signal CTR_C. That is, when the charging control signal CTR_C is enabled to a logic 'high' level, the voltage level of the test node ND_T may be gradually raised through the charging operation. The test node ND_T may be discharged based on the discharging control signal CTR_D. That is, when the discharging control signal CTR_D is enabled to a logic 'high' level, the voltage level of the test node ND_T may be gradually lowered through the discharging operation. As described with reference to FIG. 4, the first unit measurement interval UT1 may be an interval in which a defect caused by the discharging operation can be detected, and the second unit measurement interval UT2 may be an interval in which a defect caused by the charging operation can be detected.

For convenience of description, the case in which the interval extension information INF_W is '5' will be taken as an example for description. When the interval extension information INF_W is '5' it may indicate that a total measurement interval TUT includes five first and second unit measurement intervals UT1 and UT2. For example, the total measurement interval TUT may include three first unit measurement intervals UT1 and two second unit measurement intervals UT2.

The counting circuit 300B of FIG. 5 may count the counting clock signal CLK_CN during the total measurement interval TUT, and output the counting value as the counting information INF_CN.

The test circuit in accordance with the present embodiment may adjust the numbers of the first and second unit measurement intervals UT1 and UT2 included in the total measurement interval TUT, according to the interval extension information INF_W. Here, the total measurement interval TUT may include one or more first unit measurement intervals UT1 or one or more second unit measurement intervals UT2. Therefore, the test circuit may derive a defect, caused in the first unit measurement interval UT1 of the total measurement interval TUT, as the counting information INF_CN, and derive a defect, caused in the second unit measurement interval UT2 of the total measurement interval TUT, as the counting information INF_CN, That is, the test circuit may derive the counting information INF_CN on a defect caused by the charging operation and a defect caused by the discharging operation in more various manners than in FIG. 4.

The interval extension information INF_W may correspond to a loading value of the test node ND_T. That is, the test circuit in accordance with the present embodiment may adjust the numbers of the first and second unit measurement intervals UT1 and UT2 included in the total measurement interval TUT, according to the loading value of the test node ND_T. For example, when loading of the metal line coupled to the test node ND_T is high, the test circuit may extend the total measurement interval TUT to provide more test results. Therefore, the test circuit in accordance with the present embodiment may set the optimized test operation time based on the loading value of the test node ND_T.

Figure 7:
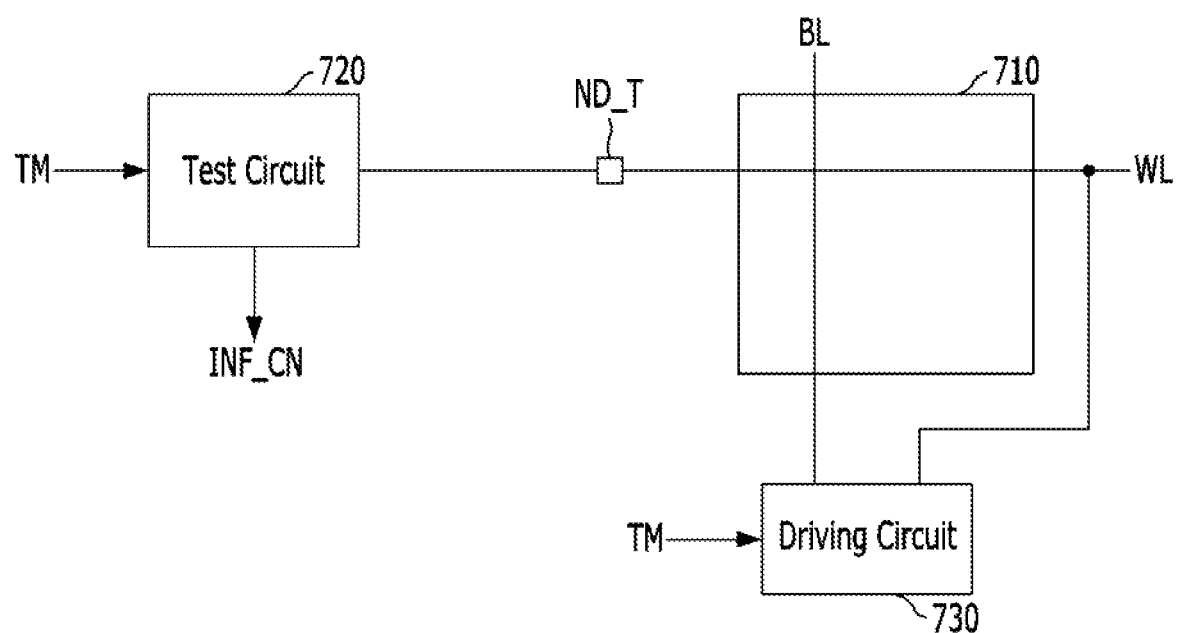
FIG. 7 is a block diagram illustrating a configuration of a semiconductor memory system in accordance with an embodiment.

FIG. 7 is a block diagram illustrating a configuration of a semiconductor memory system in accordance with an embodiment.

Referring to FIG. 7, the semiconductor memory system may include a memory circuit 710 and a test circuit 720.

The memory circuit 710 may have a plurality of memory cells (not illustrated) coupled to a word line WL. The plurality of memory cells included in the memory circuit 710 may be configured to store data. Each of the memory cells may be coupled to the word line and a bit line BL.

The test circuit 720 may be configured to perform the charging operation and the discharging operation on the test node ND_T coupled to the word line WL. The test circuit 720 may be configured to generate counting information INF_CN by performing a counting operation during a unit measurement interval from a point of time that the charging operation on the test node ND_T is completed to a point of time that the discharging operation on the test node ND_T is completed. The test circuit 720 may correspond to the test circuit of FIG. 1, the test circuit of FIG. 3 or the test circuit of FIG. 5. As described above, the counting information INF_CN may correspond to a defect of the test node Since the internal configuration of the test circuit 720 has been already described above, the detailed descriptions thereof will be omitted herein.

The semiconductor memory system may include a driving circuit 730. The driving circuit 730 may be configured to store preset data in the plurality of memory cells based on a test mode TM. The driving circuit 730 may store preset data in each of the memory cells by controlling the voltage levels of the word line WL and the bit line BL.

The semiconductor memory system in accordance with the present embodiment may store data corresponding to logic 'high' or logic 'low', for example, in the plurality of memory cells, based on the test mode TM. Therefore, with the preset data stored in the plurality of memory cells, the semiconductor memory system may perform various test operations on the word line WL.

In this connection, the test circuit 720 may include the selection circuit 400A of FIG. 3. As described above, the selection circuit 400A may be configured to select and output the voltage level of at least one reference voltage of the charging reference voltage VREF_C and the discharging reference voltage VREF_D, based on the voltage selection information INF_S. The selection circuit 400A included in the test circuit 720 may receive the test mode TM instead of the voltage selection information INF_S. Therefore, the selection circuit 400A included in the test circuit 720 may select and output the voltage level of at least one reference voltage of the charging reference voltage VREF_C and the discharging reference voltage VREF_D, based on the test mode TM, That is, the test circuit 720 may select and output the voltage level of at least one reference voltage of the charging reference voltage VREF_C and the discharging reference voltage VREF_D according to the data stored in the plurality of memory cells.

The test circuit 720 may include the setting circuit 2003 of FIG. 5, As described above, the setting circuit 2008 may be configured to set the total measurement interval based on the unit measurement interval and the interval extension information INF_W. The setting circuit 2003 included in the test circuit 720 may receive the test mode TM instead of the interval extension information INF_W. Therefore, the setting circuit 2008 included in the test circuit 720 may set the total measurement interval based on the unit measurement interval and the test mode TM, That is, the test circuit 720 may set the total measurement interval according to the data stored in the plurality of memory cells.

The semiconductor memory system in accordance with the present embodiment may store data corresponding to logic 'high' or logic 'low', for example, in the plurality of memory cells, based on the test mode TM. The semiconductor memory system may select the voltage levels of the charging reference voltage VREF_C and the discharging reference voltage VREF_D based on the test mode TM, The semiconductor memory system may set the total measurement interval based on the test mode TM. Therefore, with the preset data stored in the plurality of memory cells, the semiconductor memory system may perform more various test operations on the word line WL.

While various embodiments have been described above, it will be understood to those skilled in the art that the embodiments described are examples only. Accordingly, the operating method of a data storage device described herein should not be limited based on the described embodiments.

What is claimed is:

1. A test circuit comprising:
 a control circuit configured to control a charging operation and a discharging operation on a test node of a test target circuit; and
 a counting circuit configured to generate counting information corresponding to a defect of the test node by performing a counting operation which counts a counting clock signal during a unit measurement interval from a point of time that the charging operation on the test node is completed to a point of time that the discharging operation on the test node is completed,
 wherein the counting circuit performs the counting operation based on at least one control signal of a charging control signal and a discharging control signal.

2. The test circuit according to claim 1,
 wherein the unit measurement interval comprises a first unit measurement interval and a second unit measurement interval,
 wherein the first unit measurement interval comprises an interval from a point of time that the charging operation on the test node is completed to a point of time that the discharging operation on the test node is completed, and the second unit measurement interval comprises an interval from a point of time that the discharging operation on the test node is completed to a point of time that the charging operation on the test node is completed.

3. The test circuit according to claim 1,
 wherein the control circuit charges the test node to a preset charging voltage level through the charging operation, and discharges the test node to a preset discharging voltage level through the discharging operation.

4. The test circuit according to claim 3,
 wherein the control circuit comprises:
 a charging circuit configured to charge the test node based on the charging control signal;
 a discharging circuit configured to discharge the test node based on the discharging control signal;
 a first comparison circuit configured to generate the charging control signal by comparing the voltage of the test node to a charging reference voltage corresponding to the charging voltage level; and
 a second comparison circuit configured to generate the discharging control signal by comparing the voltage of the test node to a discharging reference voltage corresponding to the discharging voltage level.

5. The test circuit according to claim 4, further comprising a selection circuit configured to select and output the voltage level of at least one reference voltage of the charging reference voltage and the discharging reference voltage, based on voltage selection information.

6. The test circuit according to claim 5,
 wherein the voltage selection information corresponds to a loading value of the test node.

7. A test circuit comprising:
a control circuit configured to control a charging operation and a discharging operation on a test node of a test target circuit;
a setting circuit configured to set a total measurement interval based on interval extension information and a unit measurement interval from a point of time that the charging operation on the test node is completed to a point of time that the discharging operation on the test node is completed; and
a counting circuit configured to generate counting information corresponding to a defect of the test node by counting a counting clock signal during the total measurement interval corresponding to an output signal of the setting circuit.

8. The test circuit according to claim 7,
wherein the interval extension information comprises a number of unit measurement intervals included in the total measurement interval.

9. The test circuit according to claim 7,
wherein the unit measurement interval comprises a first unit measurement interval and a second unit measurement interval,
wherein the first unit measurement interval comprises an interval from a point of time that the charging operation on the test node is completed to a point of time that the discharging operation on the test node is completed, and the second unit measurement interval comprises an interval from a point of time that the discharging operation on the test node is completed to a point of time that the charging operation on the test node is completed.

10. The test circuit according to claim 7,
wherein the control circuit charges the test node to a preset charging voltage level through the charging operation, and discharges the test node to a preset discharging voltage level through the discharging operation.

11. The test circuit according to claim 10, wherein the control circuit comprises:
a charging circuit configured to charge the test node based on a charging control signal;
a discharging circuit configured to discharge the test node based on a discharging control signal;
a first comparison circuit configured to generate the charging control signal by comparing the voltage of the test node to a charging reference voltage corresponding to the charging voltage level; and
a second comparison circuit configured to generate the discharging control signal by comparing the voltage of the test node to a discharging reference voltage corresponding to the discharging voltage level.

12. The test circuit according to claim 11,
wherein the setting circuit generates an interval setting signal corresponding to the total measurement interval, based on the charging control signal, the discharging control signal, and the interval extension information.

13. The test circuit according to claim 7,
wherein the interval extension information corresponds to a loading value of the test node.

14. The test circuit according to claim 11, further comprising a selection circuit configured to select and output the voltage level of at least one reference voltage of the charging reference voltage and the discharging reference voltage, based on voltage selection information.

15. The test circuit according to claim 14,
wherein the voltage selection information corresponds to a loading value of the test node.

16. A semiconductor memory system comprising:
a memory circuit having a plurality of memory cells coupled to a word line; and
a test circuit configured to perform a charging operation and a discharging operation on a test node coupled to the word line, and generate counting information corresponding to a defect of the test node by performing a counting operation during a unit measurement interval from a point of time that the charging operation on the test node is completed to a point of time that the discharging operation on the test node is completed,
wherein the test circuit performs the counting operation based on at least one control signal of a charging control signal and a discharging control signal.

17. The semiconductor memory system according to claim 16, further comprising a driving circuit configured to store preset data in the plurality of memory cells, based on a test mode.

18. The semiconductor memory system according to claim 17, wherein the test circuit comprises:
a control circuit configured to control the charging operation and the discharging operation on the test node; and
a counting circuit configured to generate the counting information by performing the counting operation which counts a counting clock signal during the unit measurement interval.

19. The semiconductor memory system according to claim 18, wherein the control circuit comprises:
a charging circuit configured to charge the test node based on the charging control signal;
a discharging circuit configured to discharge the test node based on the discharging control signal;
a first comparison circuit configured to generate the charging control signal by comparing the voltage of the test node to a charging reference voltage corresponding to the charging voltage level; and
a second comparison circuit configured to generate the discharging control signal by comparing the voltage of the test node to a discharging reference voltage corresponding to the discharging voltage level.

20. The semiconductor memory system according to claim 19, further comprising a selection circuit configured to select and output the voltage level of at least one reference voltage of the charging reference voltage and the discharging reference voltage, based on voltage selection information corresponding to the test mode.

21. The semiconductor memory system according to claim 18, wherein the test circuit comprises:
a control circuit configured to control the charging operation and the discharging operation on the test node;
a setting circuit configured to set a total measurement interval based on the unit measurement interval and interval extension information; and
a counting circuit configured to generate the counting information by performing the counting operation which counts a counting clock signal during the total measurement interval corresponding to an output signal of the setting circuit.

22. The semiconductor memory system according to claim 21,
wherein the interval extension information comprises the number of unit measurement intervals included in the total measurement interval.

23. The semiconductor memory system according to claim 21,
   wherein the interval extension information is set based on the test mode.

* * * * *